(12) United States Patent
Ke et al.

(10) Patent No.: US 8,564,003 B2
(45) Date of Patent: Oct. 22, 2013

(54) LED PACKAGE

(75) Inventors: Chih-Hsun Ke, Hsinchu (TW); Ming-Ta Tsai, Hsinchu (TW); Chao-Hsiung Chang, Hsinchu (TW); Shiun-Wei Chan, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 60 days.

(21) Appl. No.: 13/300,618

(22) Filed: Nov. 20, 2011

(65) Prior Publication Data

US 2012/0241790 A1    Sep. 27, 2012

(30) Foreign Application Priority Data

Mar. 25, 2011   (CN) .......................... 2011 1 0073542

(51) Int. Cl.
  *H01L 33/00*    (2010.01)
(52) U.S. Cl.
  USPC ........... 257/98; 257/99; 257/100; 257/E33.06
(58) Field of Classification Search
  USPC .................................. 257/98, 99, 100, E33.06
  See application file for complete search history.

(56) References Cited

U.S. PATENT DOCUMENTS

| | | | |
|---|---|---|---|
| 2009/0065792 A1* | 3/2009 | Thompson et al. | 257/98 |
| 2009/0283781 A1 | 11/2009 | Chan et al. | |
| 2009/0289269 A1* | 11/2009 | Naum et al. | 257/98 |
| 2011/0175127 A1 | 7/2011 | Kanada et al. | |
| 2012/0062821 A1 | 3/2012 | Takeuchi et al. | |

FOREIGN PATENT DOCUMENTS

| | | |
|---|---|---|
| TW | 201021249 A1 | 6/2010 |
| TW | 201104926 A1 | 2/2011 |

* cited by examiner

*Primary Examiner* — Tan N Tran
(74) *Attorney, Agent, or Firm* — Altis & Wispro Law Group, Inc.

(57) ABSTRACT

An LED package comprises a substrate, a reflector, a light-absorbable layer, an encapsulation layer and an LED chip. The reflector comprises a first incline with an inclined angle surrounding the LED chip. The light-absorbable layer comprises a second incline with another inclined angle direct to the LED chip, wherein the inclined angle of the second incline is greater than that of the first incline and the inclined angle of the first incline is between 90 to 150 degrees.

12 Claims, 2 Drawing Sheets

# LED PACKAGE

TECHNICAL FIELD

The disclosure relates generally to a light emitting diode (LED) package, and more particularly to an LED package comprising a light-absorbable layer.

DESCRIPTION OF THE RELATED ART

LEDs are popular due to low power consumption, high efficiency, quick reaction time, long life and the absence of toxic elements such as mercury. Generally, a reflector is allocated inside an LED package to increase the light intensity and render the desired color(s), wherein the reflector may be made of Polyphthalamide (PPA), Polymethyl-methacrylate (PMMA) or other thermoplastic materials. However, these reflectors may be deteriorated due to ultraviolet when LED packages are applied to outdoor light source such as commercial billboards or streetlamps. Moreover, reducing the size of the LED packages means that the reflector has to be very thin, such that light emitted from the LED chip may be transmitted through the reflector, leading to a reduction in the light intensity and reduced ability to render color(s). Further luminescent conversion elements such as phosphors, which inside the LED packages may be stimulated unexpectedly by light illuminated from the outside. To avoid these limitations, increasing the thickness of the reflector or coating the reflector with a metallic layer are possible; nevertheless, these methods present obstacles to the reduction in size of an LED package, and the cost of manufacturing the LED packages is thereby increased.

DETAILED DESCRIPTION

Exemplary embodiments of the disclosure will now be described with reference to the accompanying drawings.

Figure 1:
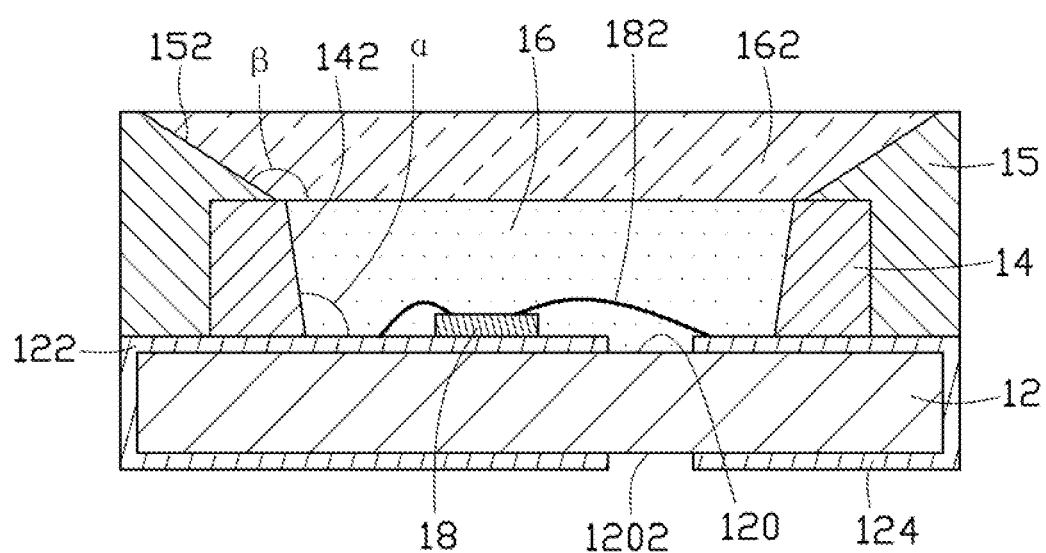
FIG. 1 is a cross section showing an LED package of the disclosure.

Referring to FIG. 1, the disclosure provides a LED package 10 comprising a substrate 12, a reflector 14, a light-absorbable layer 15, a luminescent conversion layer 16 and a LED chip 18. The substrate 12 comprises two electrodes 122, 124 each extending from a top surface 120 via a lateral side (not labeled) to a bottom surface 1202 opposite to the top surface 120 of the substrate 12. Moreover, the two electrodes 122, 124 are respectively an anode and a cathode. In the disclosure, the LED chip 18 is located on the electrode 122 and electrically connects to the electrode 122 and the electrode 124 via conductive wires 182. Alternatively, the LED chip 18 also can make electrical contact with the two electrodes 122, 124 by flip-chip or eutectic technology (not shown).

The reflector 14 is located on the top surface 120 of the substrate 12, and defines a first incline 142 directed to the LED chip 18. The first incline 142 surrounds the LED chip 18. In the disclosure, the two electrodes 122, 124 are flat and appear substantially horizontal to each other. An inclined angle α of the first incline 142 is an inclined angle between the first incline 142 and the two electrodes 122, 124. In this embodiment, the inclined angle α of the first incline 142 is between about 90 to about 150 degrees. The reflector 14 is light-reflective made from plastic or polymer selected from Polyphthalamide (PPA) or epoxy resin.

The luminescent conversion layer 16 covers the LED chip 18 and is encircled by the reflector 14. The luminescent conversion layer 16 comprises at least one luminescent conversion element (not labeled). In the disclosure, a transparent encapsulation layer 162 covers the luminescent conversion layer 16. Alternatively, the transparent encapsulation layer 162 and the luminescent conversion layer 16 can be formed integrally. In this embodiment, the transparent encapsulation layer 162 is a light emitting surface of the LED package 10 opposite to the substrate 12.

The reflector 14 is surrounded by the light-absorbable layer 15 which comprises a second incline 152 direct to the LED chip 18. An inclined angle β of the second incline 152 is an inclined angle between the second incline 152 and the luminescent conversion layer 16. The inclined angle β of the second incline 152 is greater than the inclined angle α of the first incline 142. In the disclosure, the light-absorbable layer 15 is black with a light absorbance of over 70%. The light-absorbable layer 15 can be plastic or polymer selected form PPA or epoxy resin formed by molding.

Figure 2:
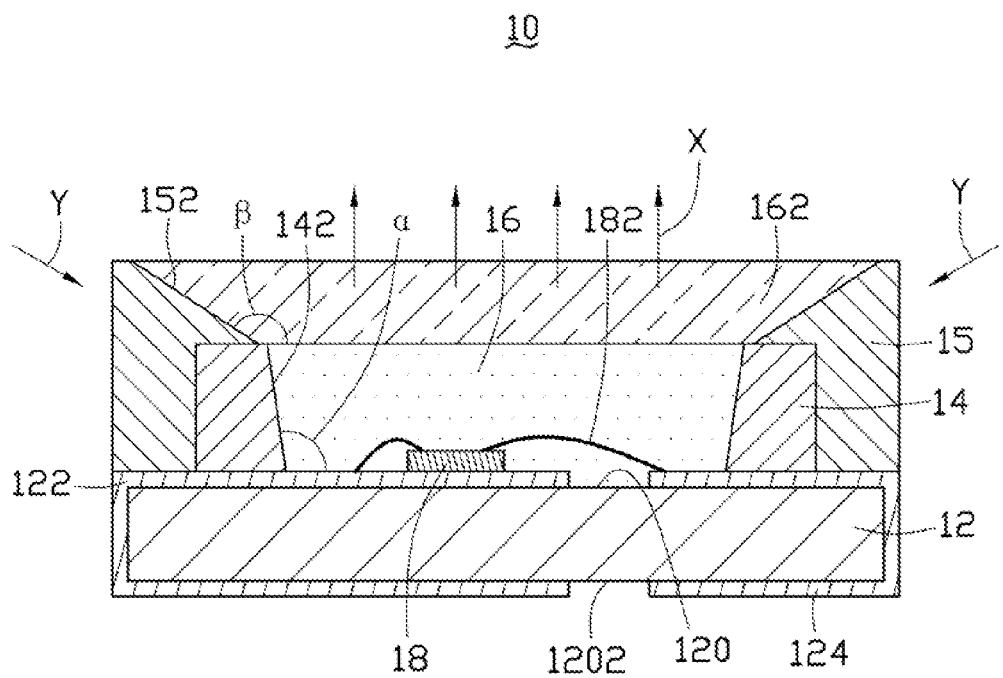
FIG. 2 is a schematic diagram showing light beams emitted from the LED package during operation.

Referring to FIG. 2, the LED chip 18 is capable of emitting radial light with current from the two electrodes 122, 124 during operation. Thereafter, a portion of the radial light may emit straight outside the luminescent conversion layer 16, or be guided directly to the transparent encapsulation layer 162 by the first inclines 142 of the reflector 14. The other portion of the radial light may excite the luminescent conversion element inside the luminescent conversion layer 16 to produce converted light, which has different wavelength to the original radial light from LED chip 18, emitting outside the luminescent conversion layer 16. By the mixture of the original radial light and the converted light, the LED package 10 provides emitting light X with high color rendering property and determined color contrast. The emitting light X is not likely absorbed by the light-absorbable layer 15, because the inclined angle β of the second incline 152 is greater than the inclined angle α of the first incline 142. That is, the emitting light X is blocked by the reflector 14 before emits to the light-absorbable layer 15. On the other, the light-absorbable layer 15 may absorb the emitted light which penetrates through the reflector 14 from the LED chip 18 due to the thinning of the reflector 14 (not shown), whereby the vignetting and the halation of light from the LED package 10 can be avoided. Accordingly, the LED package 10 can be constructed on a very small scale without reducing in the ability to render color.

The light-absorbable layer 15 is able to absorb extrinsic light Y from the outside of the LED package 10, such that the extrinsic light Y is not likely to irradiate inside the reflector 14 to inflect the ability of rendering color(s) of the LED package 10. The LED package 10 can be widely used in varied outdoor light sources, since the light-absorbable layer 15 is able to prevent the reflector 14 from deteriorating due to ultraviolet of the sunshine.

According to the disclosure, the LED package 10 comprises the light-absorbable layer 15 around the reflector 14, whereby the emitted light which penetrates through the reflector 14 from the LED chip 18 can be absorbed by the light-absorbable layer 15. Moreover, the inclined angle β of the second incline 152 is greater than the inclined angle α of the first incline 142 that the emitting light X is not likely absorbed by the light-absorbable layer 15. Thus, the LED package 10 can provide high color rendering property with determined color contrast, and vignetting or halation of light emitted from the LED package 10 can be avoided.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED package, comprising:
a substrate, having two electrodes;
an LED chip, located on one of the electrodes and electrically connecting to the two electrodes;
a reflector, having a first incline surrounding the LED chip, located on the substrate;
a luminescent conversion layer, covering the LED chip and encircled by the reflector; and
a light-absorbable layer, located around the reflector, having a second incline direct to the LED chip, wherein an inclined angle of the second incline is greater than that of the first incline.

2. The LED package as claimed in claim 1, wherein the two electrodes comprises an anode and a cathode respectively extending from a top surface of the substrate to a bottom surface opposite to the top surface.

3. The LED package as claimed in claim 2, wherein the two electrodes appear horizontal to each other.

4. The LED package as claimed in claim 3, wherein the inclined angle of the first incline is an inclined angle between the first incline and the two electrodes.

5. The LED package as claimed in claim 4, wherein the inclined angle of the first incline is between 90 to 150 degrees.

6. The LED package as claimed in claim 1, wherein the LED chip electrically connects to the two electrodes via conductive wires.

7. The LED package as claimed in claim 1, wherein the reflector is light-reflective made by plastic or polymer selected from Polyphthalamide (PPA) or epoxy resin.

8. The LED package as claimed in claim 1, wherein the inclined angle of the second incline is an inclined angle between the second incline and the luminescent conversion layer.

9. The LED package as claimed in claim 1, wherein the light-absorbable layer is made by plastic or polymer selected from Polyphthalamide (PPA) or epoxy resin.

10. The LED package as claimed in claim 9, wherein the light-absorbable layer is black with a light absorbance over 70%.

11. The LED package as claimed in claim 1, wherein a transparent encapsulation layer covers the luminescent conversion layer.

12. The LED package as claimed in claim 1, wherein the luminescent conversion layer comprises at least one luminescent element.

* * * * *